United States Patent
Tetelbaum

(10) Patent No.: US 7,178,121 B2
(45) Date of Patent: Feb. 13, 2007

(54) METHOD AND COMPUTER PROGRAM FOR ESTIMATING SPEED-UP AND SLOW-DOWN NET DELAYS FOR AN INTEGRATED CIRCUIT DESIGN

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 5 days.

(21) Appl. No.: 11/165,778

(22) Filed: Jun. 24, 2005

(65) Prior Publication Data

US 2006/0294482 A1 Dec. 28, 2006

(51) Int. Cl.
*G06F 17/50* (2006.01)

(52) U.S. Cl. .................. 716/6; 716/2; 716/12
(58) Field of Classification Search .............. 716/2, 716/6, 12, 18
See application file for complete search history.

(56) References Cited

U.S. PATENT DOCUMENTS 6,810,505 B2 * 10/2004 Tetelbaum et al. ............. 716/1
2005/0163207 A1 * 7/2005 Buckwalter et al. ........ 375/229

* cited by examiner

*Primary Examiner*—Thuan Do
(74) *Attorney, Agent, or Firm*—Eric James Whitesell

(57) ABSTRACT

A method and computer program product that provide a savings in run time for calculating net delays with cross-talk include steps of providing a coupling capacitance, a net capacitance, and one of a worst case maximum net interconnect delay and a best case minimum net interconnect delay of a net comprising a net cell and a net interconnect in an integrated circuit design; providing a worst case margin multiplier and a best case margin multiplier for the integrated circuit design; calculating a worst case minimum net interconnect delay from the worst case maximum net interconnect delay, the coupling capacitance, the net capacitance, and the worst case margin multiplier when the worst case maximum net interconnect delay is provided; and calculating a best case maximum net interconnect delay from the best case minimum net interconnect delay, the net capacitance, and the best case margin multiplier when the best case minimum net interconnect delay is provided.

28 Claims, 4 Drawing Sheets

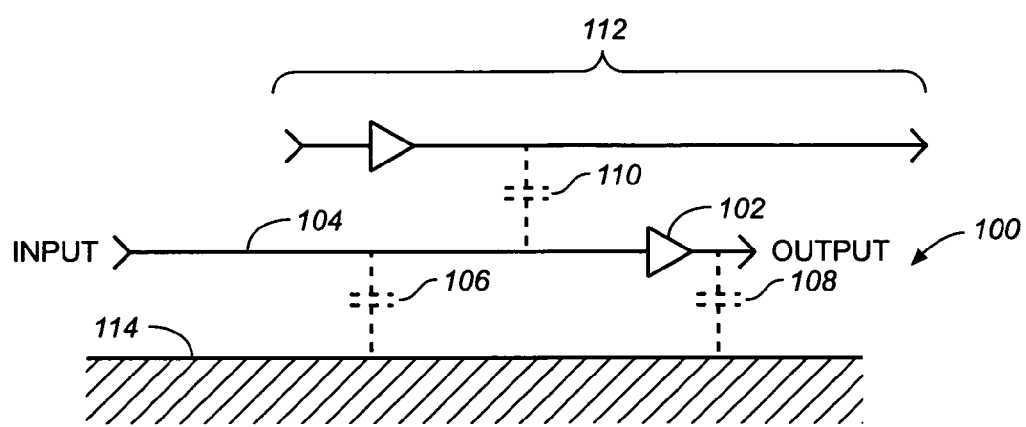
FIG._1

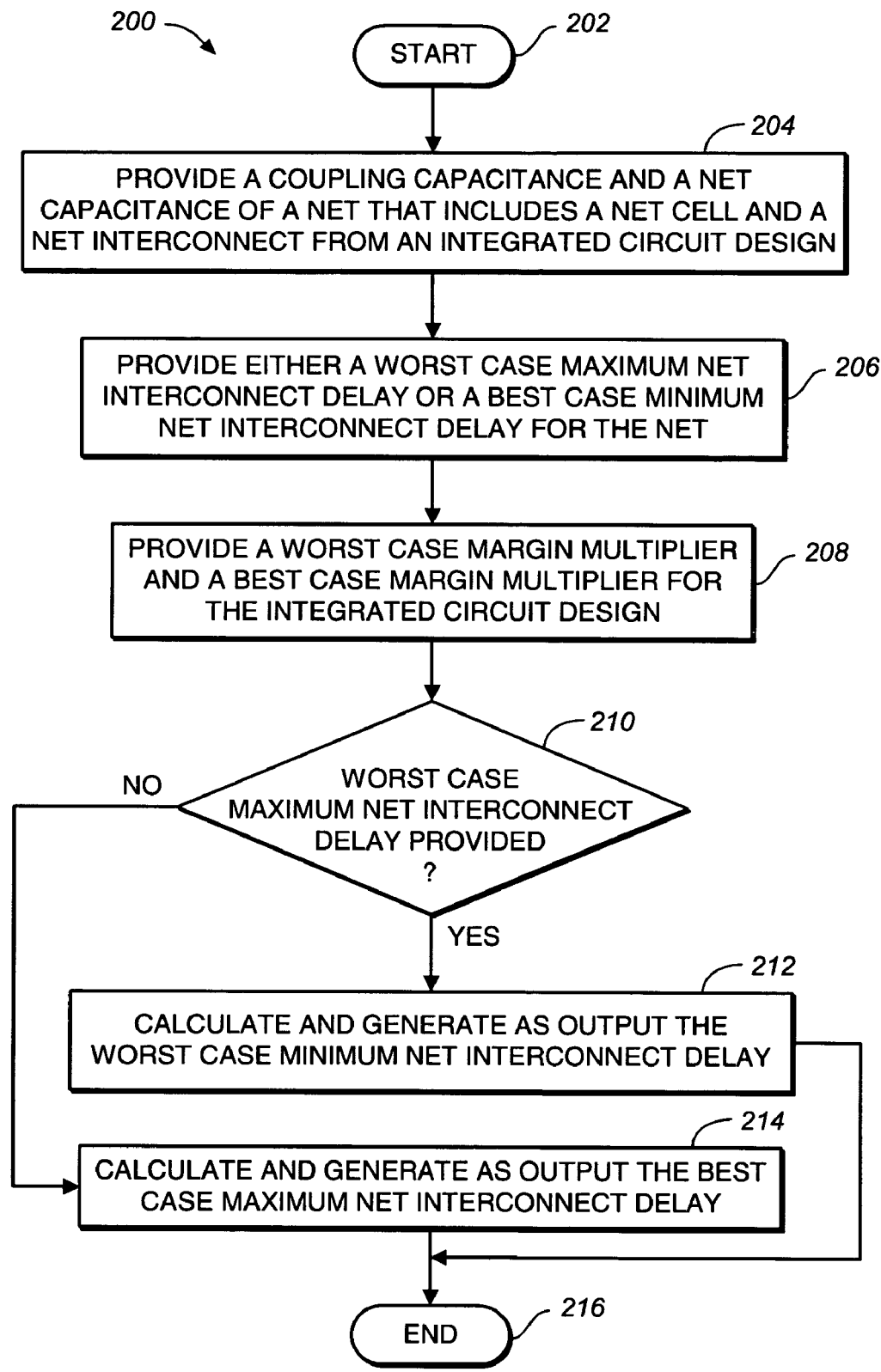
FIG._2

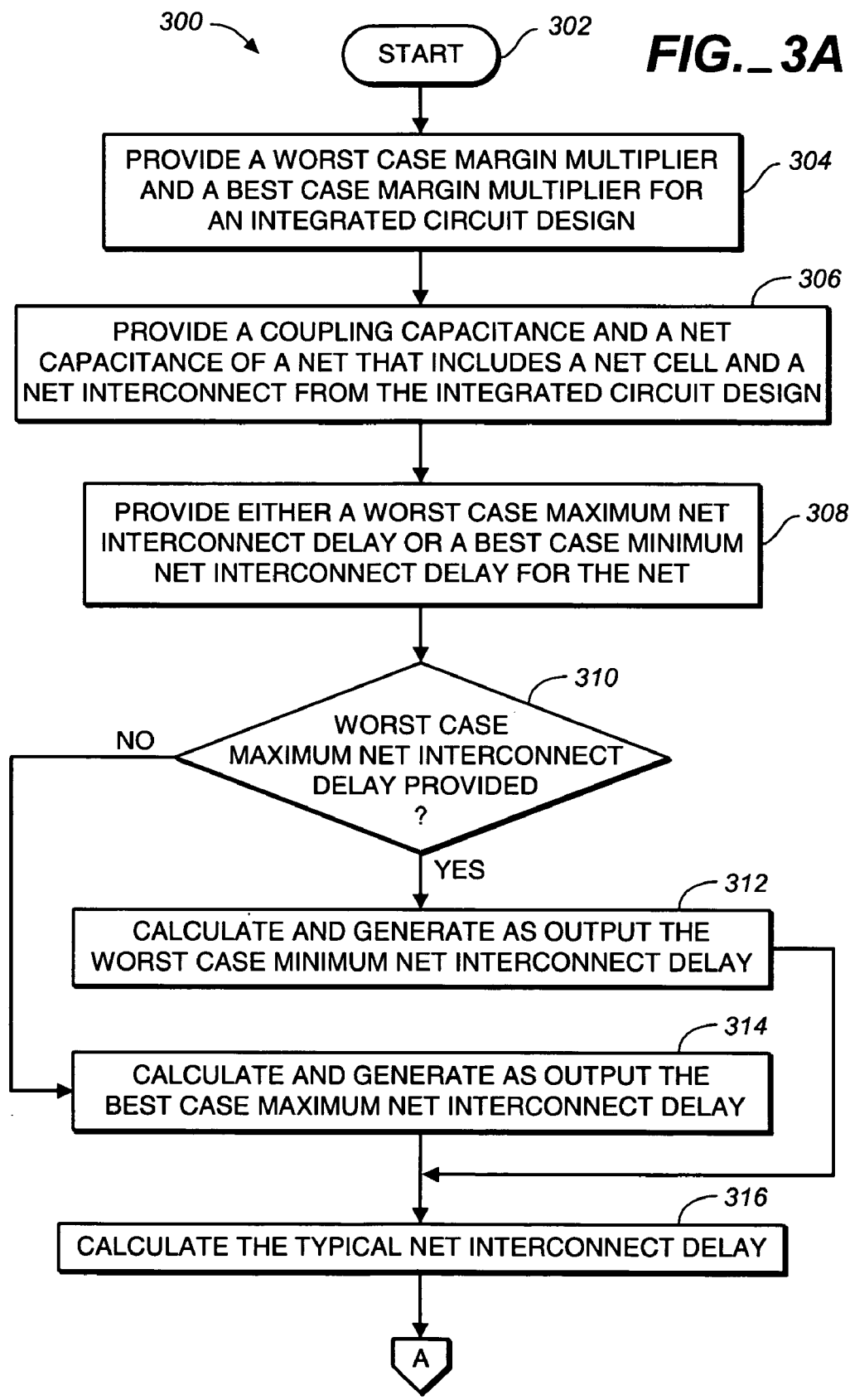
FIG._3A

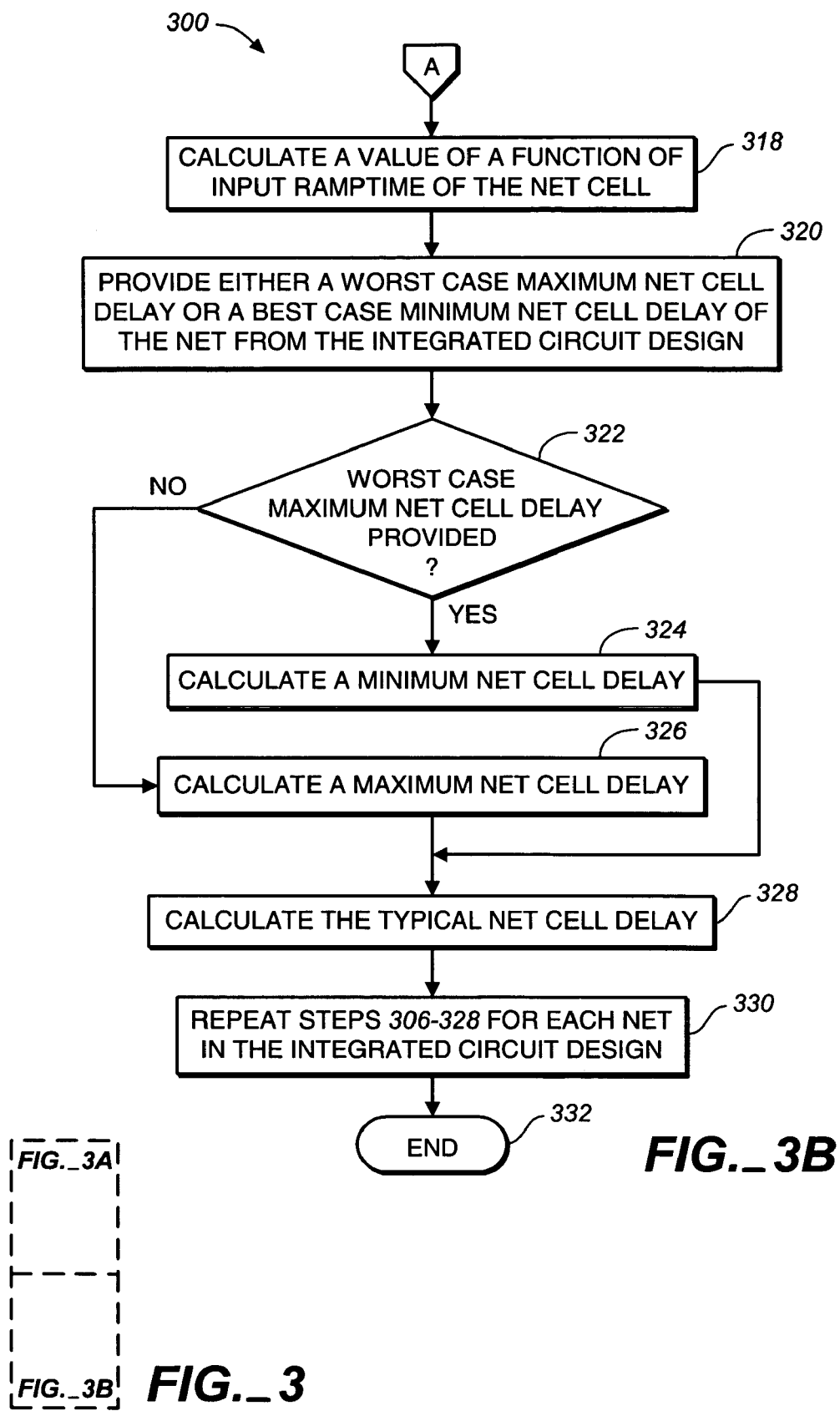

METHOD AND COMPUTER PROGRAM FOR ESTIMATING SPEED-UP AND SLOW-DOWN NET DELAYS FOR AN INTEGRATED CIRCUIT DESIGN

CROSS-REFERENCE TO RELATED APPLICATIONS

This application is related to U.S. patent application Ser. No. 10/192,989, now U.S. Pat. No. 6,810,505 B2, for INTEGRATED CIRCUIT DESIGN FLOW WITH CAPACITIVE MARGIN, incorporated herein by reference.

BACKGROUND OF THE INVENTION

1. Field of the Invention

The present invention relates generally to methods of designing electronic circuits. More specifically, but without limitation thereto, the present invention relates to a method of simplifying integrated circuit design flow by introducing appropriate capacitive margins to estimate timing delays.

2. Description of Related Art

In previous methods for designing integrated circuits, several iterations of cell placement, routing and signal analysis of the capacitive effects of the interconnections are typically required to satisfy timing constraints, sometimes requiring weeks of cross-talk analysis after parasitic extraction is performed on the circuit floorplan. Because cross-talk analysis is so time consuming, it presents a significant bottleneck in the design cycle of integrated circuits.

An alternative to the time-consuming process of cross-talk analysis is the use of capacitive margins to estimate delays induced by cross-talk. An example of estimating cross-talk using capacitive margins is disclosed in U.S. Pat. No. 6,810,505 B2 for INTEGRATED CIRCUIT DESIGN FLOW WITH CAPACITIVE MARGIN. The method of delay analysis disclosed in that patent estimates slow-down delays for worst case setup time and speed-up delays for best case hold time.

SUMMARY OF THE INVENTION

A method and computer program product that provide a savings in run time for estimating speed-up and slow-down net delays for an integrated circuit design include steps of providing a coupling capacitance, a net capacitance, and either a worst case maximum net interconnect delay or a best case minimum net interconnect delay for a net that includes a net cell and a net interconnect of an integrated circuit design. The method includes steps of providing a worst case margin multiplier and a best case margin multiplier for the integrated circuit design; calculating a worst case minimum net interconnect delay from the worst case maximum net interconnect delay, the coupling capacitance, the net capacitance, and the worst case margin multiplier when the worst case maximum net interconnect delay is provided; and calculating a best case maximum net interconnect delay from the best case minimum net interconnect delay, the net capacitance, and the best case margin multiplier when the best case minimum net interconnect delay is provided.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein:

FIG. 1 illustrates a schematic diagram of a net of an integrated circuit design of the prior art;

FIG. 2 illustrates a flow chart for an embodiment of a method of estimating speed-up and slow-down net delays for a net of an integrated circuit design; and FIG. 3 illustrates a flow chart for an embodiment of a method of estimating speed-up and slow-down net delays for an integrated circuit design.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that are useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

FIG. 1 illustrates a schematic diagram of a net 100 of an integrated circuit design of the prior art. Shown in FIG. 1 are a net cell 102, a net interconnect 104, a net interconnect capacitance 106, a net load capacitance 108, a coupling capacitance 110, an aggressor net 112, and a ground plane 114.

In FIG. 1, the net 100 includes the net cell 102 and the net interconnect 104. The net interconnect capacitance 106 is the capacitance from the net interconnect to the ground plane 114. The coupling capacitance 110 is the capacitance between the net interconnect and the aggressor net 112. The total net capacitance is the sum of the net interconnect capacitance 106 and the coupling capacitance 110. The aggressor net 112 is called an "aggressor" because it is a source of cross-talk noise that is coupled to the "victim" net 100 via the coupling capacitance 110. Cross-talk noise distorts the waveform of the signal arriving at the input of the net cell 102, which may result in a slow-down delay or a speed-up delay. Slow-down delay is delay resulting from cross-talk noise that retards the arrival of a signal at the input of the net cell 102, while speed-up delay is delay resulting from cross-talk noise that advances the arrival of the signal at the input of the net cell 102.

In one aspect of the present invention, a method of estimating speed-up and slow-down net delays for an integrated circuit design includes steps of:

(a) providing a coupling capacitance, a net capacitance, and one of a worst case maximum net interconnect delay and a best case minimum net interconnect delay of a net comprising a net cell and a net interconnect in an integrated circuit design;

(b) providing a worst case margin multiplier and a best case margin multiplier for the integrated circuit design;

(c) calculating a worst case minimum net interconnect delay from the worst case maximum net interconnect delay, the coupling capacitance, the net capacitance, and the worst case margin multiplier when the worst case maximum net interconnect delay is provided in step (a); and (d) calculating a best case maximum net interconnect delay from the best case minimum net interconnect delay, the net capacitance, and the best case margin multiplier when the best case minimum net interconnect delay is provided in step (a).

Estimating cross-talk delay using a margin factor advantageously reduces the number of iterations in the design flow and avoids the necessity of cross-talk analysis. Instead, an incremental cross-talk delay is estimated and associated with each net. Specifically, interconnect and coupling capacitances are scaled using margin factors, which may be considered as individually adjustable Miller capacitance factors.

A typical design flow of an integrated circuit generates as output a file in standard parasitic exchange format (SPEF) with wire capacitances and coupling capacitances (CcSPEF) and a file with interconnect and cell delays in standard delay format (SDF).

Because the interconnect parasitic network coupling capacitance used for delay calculations is margined, that is, scaled by a margin factor, detailed cross-talk analysis (delay shift analysis) is unnecessary. By avoiding cross-talk analysis, a significant savings in setup, computation, and interpretation is realized. The margined delay calculations have been demonstrated to adequately bracket the delay shift due to cross-talk as seen in detailed cross-talk analysis, while minimizing the overall magnitude of the margin factors.

In addition to calculating worst case slow-down delays to check setup time and best case speed-up delays to check hold time, it is also desirable to check worst case speed-up delays to check for hold time violations and best case slow-down delays to check for setup time violations in the circuit design. While this is possible with two extra run cycles of the delay calculator in U.S. Pat. No. 6,810,505 B2, a new delay calculator is described below that estimates speed-up delays for worst case based on the worst case slow-down delays and calculates slow-down delays for best case based on the best case speed-up delays as well as typical delays, that is, delays that do not includes the effects of cross-talk. The new delay calculator provides a fast, accurate method of checking all best case and worst case timing extremes while advantageously avoiding extra run cycles of the delay calculator. The new delay calculator may also be used with a variety of different semiconductor technologies.

The margin factors $m=m\_wc$ for worst case have a value of more than one, and the margin factors $m=m\_bc$ for best case have a value of less than one. The margin factors $m=m\_wc$ and $m=m\_bc$ have different values for different design tools and in different stages of the circuit design. The margin factors are technology dependent, and are preferably maintained in a technology parameters library so that the same design flow may be used with a variety of different technologies. Third party technology files need not be changed, because cross-talk avoidance and analysis is preferably performed using non-margined coupling capacitance values.

For example, the margin factors may have a typical value of $m\_wc=m\_bc=1$ without cross-talk and $m\_wc=1.5$ and $m\_bc=0.5$ with cross-talk. Noise and delay analysis following cell placement are unnecessary, since the capacitive margins, that is, the margin factors $m\_wc$ and $m\_bc$, are embedded in the technology parameters library used in the design flow. Power, ground, and guard nets are appropriately accounted for, because they are represented by grounded capacitances in the interconnect capacitance and cell capacitance files.

The delay calculator uses the worst case margin multiplier $m\_wc$ to increase the net coupling capacitance of each net according to equation (1):

$$C\_net\_wc\_margin = Cg + m\_wc * Cc \quad \text{Equation (1)}$$

where:

$C\_net\_wc\_margin$ is the worst case margined net capacitance;

$Cg$ is the net interconnect capacitance to ground; and $Cc$ is the net coupling capacitance between the net and an aggressor net.

A coupling ratio X may be defined as follows:

$$X = Cc/C\_net\_wc\_nomargin \quad \text{Equation (2)}$$

The delay calculator calculates the worst case net delay $D\_net\_wc = MAX = f(C\_net\_wc\_margin)$ from which the net interconnect delay including the cross-talk slow-down delay is derived. The delay calculator forms the triplet ($D\_net\_wc\_margin$, $D\_net\_wc\_margin$, $D\_net\_wc\_margin$) from the worst case maximum net delay, that is, (MAX, MAX, MAX). The margin multipliers $m\_wc=1.5$ and $m\_bc=0.5$ may be used to illustrate possible net capacitance values for worst case non-margined net capacitance, worst case margined net capacitance, best case non-margined net capacitance, and best case margined net capacitance respectively as defined in equations (3):

$$C\_net\_wc\_nomargin = Cg + Cc \text{(worst case without margin)} \quad (a)$$

$$C\_net\_wc\_margin = Cg + 1.5Cc \text{(worst case with margin)} \quad (b)$$

$$C\_net\_bc\_nomargin = Cg + Cc \text{(best case without margin)} \quad (c)$$

$$C\_net\_bc\_margin = Cg + 0.5Cc \text{(best case with margin)} \quad (d) \quad \text{Equations (3)}$$

Equations (3) are used initially for delay estimation, and the margin multiplier $m\_wc$ is taken into account as a function of the coupling ratio X in equation (2). Since equation (3a) is equivalent to equation (3c), the coupling ratio X in equation (2) may also be expressed as the coupling capacitance divided by the net capacitance ($Cg+Cc$), that is, with no margin:

$$X = Cc/C\_net\_bc\_nomargin = Cc/(Cg+Cc) \quad \text{Equation (4)}$$

The net stage delay D for the net 100 is expressed as the sum of the net cell delay and the net interconnect delay:

$$D = D\_cell + D\_int \quad \text{Equation (5)}$$

The net cell delay $D\_cell$ and the net interconnect delay $D\_int$ are preferably considered separately to conform to the standard delay format (SDF) files used with common integrated circuit design tools.

If the worst case maximum net interconnect delay $MAX = D\_int\_wc\_margin$ is provided, for example, by a circuit simulation program, then the minimum interconnect delay D_int_min and the typical interconnect delay D_int_typ may be estimated as follows. The worst case maximum interconnect delay may be approximated in a resistance-capacitance (RC) model as a linear function of the net load capacitance C_net:

$$D\_int\_wc\_margin = k \cdot R\_net\_wc \cdot C\_net\_wc\_margin \quad \text{Equation (6)}$$
$$= R \cdot C\_net\_wc\_margin$$

where:
D_int_wc_margin is the worst case margined net interconnect delay;
k is a proportionality constant;
R_net_wc is the net interconnect resistance; and
R=k·R_net_wc is a scaled net resistance.

From the RC model of equation (6), the scaled resistance R may be expressed as a function of the net capacitance:

$$R = D\_int\_wc\_margin / C\_net\_wc\_margin \quad \text{Equation (7)}$$
$$= MAX / C\_net\_wc\_margin$$

Taking into account the worst case margin multiplier m=m_wc=1.5, the best case margin multiplier m=m_bc=0.5, and the no-margin multiplier m=1, the typical net interconnect delay TYP may be calculated as follows:

$$TYP = R(C\_net\_wc\_margin - 0.5Cc) \quad \text{Equation (8)}$$
$$= R \cdot C\_net\_wc\_margin(1 - 0.5X)$$
$$= MAX(1 - 0.5X)$$

Cc is the net coupling capacitance, and
X is the coupling ratio in equation (4).

Either the coupling capacitance Cc or the coupling ratio X may be stored in the capacitance files derived for each net in the design flow according to well-known techniques.

The minimum interconnect delay MIN may be calculated as follows:

$$MIN = R(C\_net\_wc\_margin - Cc) \quad \text{Equation (9)}$$
$$= R \cdot C\_net\_wc\_margin(1 - x)$$
$$= MAX(1 - X)$$

A general expression for the margined net interconnect capacitance is given by the following equation:

$$C\_int = C[1+(m-1)X] \quad \text{Equation (10)}$$

where C is the net capacitance (Cg+Cc).

Equation (10) may be substituted in equation (7) to express the minimum and maximum interconnect delays as follows:

$$D\_int\_min = R \cdot C\_net[1+(m\_bc-1)X] \quad \text{Equation (11)}$$

$$D\_int\_max = R \cdot C\_net[1+(m\_wc-1)X] \quad \text{Equation (12)}$$

where the coupling ratio X is the coupling ratio in equation (4).

The minimum interconnect delay D_int_min may be expressed as a function of the maximum interconnect delay by dividing equation (11) by equation (12):

$$D\_int\_min = \frac{D\_int\_max[1+(m\_bc-1)X]}{1+(m\_wc-1)X} \quad \text{Equation (13)}$$

The margin multipliers m_wc and m_bc depend on the coupling ratio X. Exemplary values are m_bc=0.5 and m_wc=1.5 or 2. Accordingly, equation (13) may be rewritten as follows:

$$D\_int\_min = \quad \text{Equarition (14)}$$

$$\frac{D\_int\_max[1 - 0.5X]}{1 + 0.5X} \text{ if } 0.1 \leq X < 0.2 \text{ or } X > 0.3$$

or $$D\_int\_min =$$

$$\frac{D\_int\_max[1 - 0.5X]}{1 + X} \text{ if } 0.2 < X \leq 0.3 \text{ or } X < 0.1$$

Alternatively, the typical interconnect delay value TYP may also be calculated as the mean value of the minimum and maximum interconnect delays.

The delay calculator may then generate the triplet (MIN, TYP, MAX) for the net interconnect delay from the estimated values above given the worst case maximum interconnect delay.

The cell delay D_cell of a net may be approximated as a linear function of the net load capacitance C_net as follows:

$$D\_cell = a \cdot C\_net + D\_t\_r \quad \text{Equation (15)}$$

where a is a proportionality constant and D_t_r is a value of a function of the input ramptime of the net cell.

Equations for the minimum and maximum cell delay may be derived by substituting the general expression in equation (10) for the margined net interconnect capacitance in equation (15) as follows:

$$D\_cell\_min = a \cdot C[1+(m\_bc-1)X] + D\_t\_r \quad \text{Equation (16)}$$

$$D\_cell\_max = a \cdot C[1+(m\_wc-1)X] + D\_t\_r \quad \text{Equation (17)}$$

where C is the total net capacitance without margin, and X is the coupling ratio in equation (4).

The minimum cell delay may be expressed as a function of the maximum cell delay by dividing equation (16) by equation (17):

$$D\_cell\_min = \quad \text{Equation (18)}$$

$$\frac{(D\_cell\_max - D\_t\_r)[1+(m\_bc-1)X]}{1+(m\_wc-1)X} + D\_t\_r$$

The margin multipliers m_wc and m_bc depend on the coupling ratio X. Exemplary values are m_bc=0.5 and m_wc=1.5 or 2. Accordingly, equation (18) may be rewritten as follows:

$$D\_cell\_min = \quad \text{Equarition (19)}$$

$$\frac{(D\_cell\_max - t)[1 - 0.5X]}{1 + 0.5X} + D\_t\_r \text{ if } 0.1 \leq X <$$

$$0.2 \text{ or } X > 0.3$$

-continued or $$D\_cell\_min = \frac{(D\_cell\_max - t)[1 - 0.5X]}{1 + X} + D\_t\_r \text{ if } 0.2 < X \leq 0.3 \text{ or } X < 0.1$$

The value of D_t_r may be found for the net cell from equation (15) as follows. Using typical input ramptime values for intrinsic delay D__0.5, that is, the delay until 0.5 of the supply voltage rail VDD, and minimum and maximum loads C_min and C_max from the cell library yields the following equations:

$$D\_0.5(C\_min, t\_r) = a \cdot C\_min + D\_t\_r \quad \text{Equation (20)}$$

$$D\_0.5(C\_max, t\_r) = a \cdot C\_max + D\_t\_r \quad \text{Equation (21)}$$

Solving equations (20) and (21) for D_t_r yields the following formula which may be calculated using the worst case minimum ramptime value for t_r in the cell library:

$$D\_t\_r = \frac{D\_0.5(C\_min, t\_r)C\_max - D\_0.5(C\_max, t\_r)C\_min}{C\_max - C\_min} \quad \text{Equation (22)}$$

The typical cell delay D_cell_typ may be calculated as the mean value of the minimum cell delay D_cell_min and the maximum cell delay D_cell_max.

The delay calculator may then generate the triplet (D_cell_min, D_cell_typ, D_cell_max) for the estimated net cell delay from the estimated values above given the worst case maximum cell delay.

If the best case minimum interconnect delay MIN=D_int_bc_margin is provided, then the maximum interconnect delay D_int_max and the typical interconnect delay D_int_typ may be estimated as follows. The minimum interconnect delay may be approximated in a resistance-capacitance (RC) model as a linear function of the net load capacitance C_net as in equation (23):

$$D\_int\_bc\_margin = k \cdot R\_net\_bc \cdot C\_net\_bc\_margin \quad \text{Equation (23)}$$
$$= R \cdot C\_net\_bc\_margin$$

where:

D_int_bc_margin is the best case margined interconnect delay;

k is a proportionality constant;

R_net_bc is the net interconnect resistance; and

R=k·R_net_bc is a scaled net resistance.

From the RC model of equation (23), the scaled resistance R may be expressed as a function of the net capacitance:

$$R = D\_int\_bc\_margin / C\_net\_bc\_margin \quad \text{Equation (24)}$$
$$= MIN / C\_net\_bc\_margin$$

Taking into account the worst case margin multiplier m=m_wc=1.5, the best case margin multiplier m=m_bc=0.5, and the no margin multiplier m=1, the typical interconnect delay TYP may be calculated in equation (25):

$$TYP = R(C\_net\_bc\_margin - 0.5Cc) \quad \text{Equation (25)}$$
$$= R \cdot C\_net\_bc\_margin(1 - 0.5X)$$
$$= MIN(1 - 0.5X)$$

where:

Cc is the net coupling capacitance, and X is the coupling ratio given by equation (4).

Either the coupling capacitance Cc or the coupling ratio X may be stored in the capacitance files for each net according to well-known techniques.

The maximum interconnect delay MAX may be calculated in equation (26):

$$MAX = R(C\_net\_bc\_margin - Cc) \quad \text{Equation (26)}$$
$$= R \cdot C\_net\_bc\_margin(1 - x)$$
$$= MIN(1 - X)$$

A general expression for the margined net interconnect capacitance is given by the following equation:

$$C\_int = C[1 + (m-1)X] \quad \text{Equation (27)}$$

where C is the net capacitance (Cg+Cc).

The minimum and maximum interconnect delays may be expressed as follows:

$$D\_int\_max = R \cdot C[1 + (m\_wc - 1)X] \quad \text{Equation (28)}$$

$$D\_int\_min = R \cdot C[1 + (m\_bc - 1)X] \quad \text{Equation (29)}$$

The minimum interconnect delay may be expressed as a function of the maximum interconnect delay by dividing equation (28) by equation (29):

$$D\_int\_max = \frac{D\_int\_min[1 + (m\_wc - 1)X]}{1 + (m\_bc - 1)X} \quad \text{Equation (30)}$$

The margin multipliers m_wc and m_bc depend on the coupling ratio X. Exemplary values are m_bc=0.5 and m_wc=1.5 or 2. Accordingly, equation (30) may be rewritten as follows:

$$D\_int\_max = \frac{D\_int\_min[1 - 0.5X]}{1 + 0.5X} \text{ if } 0.1 \leq X < 0.2 \text{ or } X > 0.3 \quad \text{Equartion (31)}$$

or $$D\_int\_max = \frac{D\_int\_min[1 - 0.5X]}{1 + X} \text{ if } 0.2 < X \leq 0.3 \text{ or } X < 0.1$$

Alternatively, the typical interconnect delay value TYP may be calculated as the mean value of the minimum and maximum interconnect delays.

The delay calculator may then generate as output the triplet (MIN, TYP, MAX) for the net interconnect delay from the estimated values calculated as described above given the best case minimum interconnect delay.

The cell delay D_cell of a net may be approximated as a linear function of the net load capacitance C_net as follows:

$$D\_cell = a \cdot C\_net + D\_t\_r \quad \text{Equation (32)}$$

where a is a proportionality constant and D_t_r is a function of the input ramptime of the net cell.

Equations for the minimum and maximum cell delay may be derived by substituting the general expression for the margined net interconnect capacitance in equation (27) in equation (32) as follows:

$$D\_cell\_max = a \cdot C[1+(m\_wc-1)X] + D\_t\_r \quad \text{Equation (33)}$$

$$D\_cell\_min = a \cdot C[1+(m\_bc-1)X] + D\_t\_r \quad \text{Equation (34)}$$

where C is the net capacitance (Cg+Cc) without margin, and X is the coupling ratio given by equation (4).

The minimum cell delay may be expressed as a function of the maximum cell delay by dividing equation (33) by equation (34):

$$D\_cell\_max = \frac{(D\_cell\_min - D\_t\_r)[1+(m\_wc-1)X]}{1+(m\_bc-1)X} + D\_t\_r \quad \text{Equation (35)}$$

The margin multipliers m_wc and m_bc depend on the coupling ratio X. Exemplary values are m_bc=0.5 and m_wc=1.5 or 2. Accordingly, equation (35) may be rewritten as follows:

$$D\_cell\_min = \frac{(D\_cell\_max - D\_t\_r)[1-0.5X]}{1+0.5X} + t \text{ if } 0.1 \leq$$

$$X < 0.2 \text{ or } X > 0.3 \quad \text{Equation (36)}$$

or $$D\_cell\_min = \frac{(D\_cell\_max - D\_t\_r)[1-0.5X]}{1+X} + t \text{ if } 0.2 <$$

$$X \leq 0.3 \text{ or } X < 0.1$$

The value D_t_r of the function of the input ramptime may be found from the cell input ramptime t_r and equation (32) as follows. Using typical input ramptime values for intrinsic delay D_0.5, that is, the delay until 0.5 of the supply voltage rail VDD, with minimum and maximum load capacitances C_min and C_max from the cell library yields the following equations:

$$D\_0.5(C\_min, t\_r) = a \cdot C\_min + D\_t\_r \quad \text{Equation (37)}$$

$$D\_0.5(C\_max, t\_r) = a \cdot C\_max + D\_t\_r \quad \text{Equation (38)}$$

Solving equations (37) and (38) for the value D_t_r of the function of the net cell input ramptime yields the following formula, which may be calculated, for example, from the best case value of input ramptime in the cell library:

$$D\_t\_r = \frac{D\_0.5(C\_min, t\_r)C\_max - D\_0.5(C\_max, t\_r)C\_min}{C\_max - C\_min} \quad \text{Equation (39)}$$

The typical cell delay D_cell_typ may be calculated, for example, as the mean value of the minimum cell delay D_cell_min and the maximum cell delay D_cell_max.

The delay calculator then generates the triplet (D_cell_min, D_cell_typ, D_cell_max) as output for a standard delay format file.

To calculate the net cell delay, the net cell input ramptime t_r is needed for each net as described above. Accordingly, it is desirable to calculate the value D_t_r for the worst case and the best case for each net cell in the cell library using equation (39). The minimum input ramptime value for each cell may be used to achieve generally accurate results for the estimated cell delays. The delay calculator may then retrieve the values of D_t_r from the cell library as needed without repeating the calculations.

Although the embodiments of the present invention illustrated herein are specifically directed to wire capacitances and cross-coupling wire capacitances of the wire interconnections, other circuit parameters may be margined in various embodiments of the present invention to simplify design flows for a variety of applications and technologies.

FIG. 2 illustrates a flow chart 200 for an embodiment of a method of estimating speed-up and slow-down net delays in an integrated circuit design for the net of FIG. 1.

Step 202 is the entry point of the flow chart 200.

In step 204, a worst case margin multiplier and a best case margin multiplier for an integrated circuit design are provided, for example, from a cell technology library.

In step 206, a coupling capacitance and a net capacitance of a net that includes a net cell and a net interconnect from the integrated circuit design are provided. The integrated circuit design may be provided, for example, as a netlist and a cell library.

In step 208, either a worst case maximum net interconnect delay or a best case minimum net interconnect delay for the net is provided, for example, by a circuit simulation program.

In step 210, if the worst case maximum net interconnect delay is provided in step 208, the method continues from step 212. If the best case minimum net interconnect delay is provided in step 208, the method continues from step 214.

In step 212, the worst case minimum net interconnect delay is calculated and generated as output as described above from the worst case maximum net interconnect delay, the coupling capacitance, the net capacitance, and the worst case margin multiplier, and the method continues from step 216.

In step 214, the best case maximum net interconnect delay is calculated and generated as output as described above from the best case minimum net interconnect delay, the net capacitance, and the best case margin multiplier.

Step 216 is the exit point of the flow chart 200.

The method illustrated in the flowchart of FIG. 2 may be embodied in a computer program product and implemented by a computer according to well known programming techniques.

In another embodiment, a computer program product includes a medium for embodying a computer program for input to a computer and a computer program embodied in the medium for causing the computer to perform steps of:

(a) providing a coupling capacitance, a net capacitance, and one of a worst case maximum net interconnect delay and a best case minimum net interconnect delay of a net comprising a net cell and a net interconnect in an integrated circuit design;

(b) providing a worst case margin multiplier and a best case margin multiplier for the integrated circuit design;

(c) calculating and generating as output a worst case minimum net interconnect delay from the worst case maximum net interconnect delay, the coupling capacitance, the net capacitance, and the worst case margin multiplier when the worst case maximum net interconnect delay is provided in step (a); and (d) calculating and generating as output a best case maximum net interconnect delay from the best case minimum net interconnect delay, the net capacitance, and the best case margin multiplier when the best case minimum net interconnect delay is provided in step (a).

The method of FIG. 2 may be expanded to include additional steps for each net in an integrated circuit design as illustrated in FIG. 3.

FIG. 3 illustrates a flow chart 300 for an embodiment of a method of estimating speed-up and slow-down net delays for an integrated circuit design.

Step 302 is the entry point of the flow chart 300.

In step 304, a worst case margin multiplier and a best case margin multiplier for an integrated circuit design are provided, for example, from a cell technology library.

In step 306, a coupling capacitance and a net capacitance of a net that includes a net cell and a net interconnect from the integrated circuit design are provided. The integrated circuit design may be provided, for example, as a netlist and a cell library.

In step 308, either a worst case maximum net interconnect delay or a best case minimum net interconnect delay for the net is provided, for example, by a circuit simulation program.

In step 310, if the worst case maximum net interconnect delay is provided in step 308, the method continues from step 312. If the best case minimum net interconnect delay is provided in step 308, the method continues from step 314.

In step 312, a worst case minimum net interconnect delay is calculated and generated as output from the worst case maximum net interconnect delay, the coupling capacitance, the net capacitance, and the worst case margin multiplier when the worst case maximum net interconnect delay is provided in step 308. For example, the worst case minimum net interconnect delay may be calculated substantially from

MIN=MAX*(1−X)

where MIN is the worst case minimum net interconnect delay, MAX is the worst case maximum net interconnect delay provided in step (a), and X is the coupling ratio in equation (4).

In step 314, a best case maximum net interconnect delay is calculated and generated as output from the best case minimum net interconnect delay, the net capacitance, and the best case margin multiplier when the best case minimum net interconnect delay is provided in step 308. For example, the best case maximum net interconnect delay may be calculated substantially from

MAX=MIN*(1+X)

where MAX is the best case minimum net interconnect delay, MIN is the best case minimum net interconnect delay provided in step (a), and X is the coupling ratio in equation (4).

In step 316, the typical net interconnect delay is calculated, for example, as the mean of the worst case minimum net interconnect delay and the worst case maximum net interconnect delay. Alternatively, the typical net interconnect delay may be calculated from the worst case maximum net interconnect delay, the coupling capacitance, the net capacitance, and the worst case margin multiplier substantially from $$TYP = MAX(1-0.5X)$$

or $$TYP = MIN(1+0.5X)$$

where TYP is the typical net interconnect delay, MIN is the best case minimum net interconnect delay provided in step 304, MAX is the worst case maximum net interconnect delay provided in step 304, and X is the coupling ratio in equation (4).

In step 318, a value of a function of input ramptime of the net cell is calculated from the net cell input ramptime, the maximum net capacitance, and the minimum net capacitance. The net cell input ramptime may be obtained, for example, from a cell library. The the maximum and minimum net capacitance values may be obtained, for example, from the integrated circuit design capacitance files. The value of the function of input ramptime may be calculated substantially from $$D\_t\_r = \frac{D\_0.5(C\_min, t\_r)C\_max - D\_0.5(C\_max, t\_r)C\_min}{C\_max - C\_min}$$

where D_t_r is the value of the function of input ramptime, t_r is the input ramptime of the net cell, C_min is a minimum load capacitance of the net cell, C_max is a maximum load capacitance of the net cell, and D__0.5 is an intrinsic delay for the input ramptime of the net cell and the load capacitance.

In step 320, either a worst case maximum net cell delay or a best case minimum net cell delay of the net is provided from the integrated circuit design, for example, by a circuit simulation program according to well-known techniques.

In step 322, if the worst case maximum net cell delay of the net is provided in step 320, then the method continues from step 324. If the best case minimum net cell delay of the net is provided in step 320, then the method continues from step 326.

In step 324, a minimum net cell delay is calculated from the worst case maximum net cell delay, the net capacitance, the best case margin multiplier, the worst case margin multiplier, and the value of the function of input ramptime. For example, the minimum net cell delay may be calculated substantially from $$D\_cell\_min = \frac{(D\_cell\_max - D\_t\_r)[1 + (m\_bc - 1)X]}{1 + (m\_wc - 1)X} + D\_t\_r$$

where D_cell_min is the minimum net cell delay, D_cell_max is the worst case maximum net cell delay, m_wc is the worst case multiplier, m_bc is the best case multiplier, and X is the coupling ratio in equation (4). The method continues from step 328.

In step 326, a maximum net cell delay is calculated from the best case minimum net cell delay, the net capacitance, the best case margin multiplier, the worst case margin multiplier, and the value of the function of input ramptime when the best case maximum net cell delay is provided in step 320. For example, the function of input ramptime may be calculated substantially from $$D\_cell\_max = \frac{(D\_cell\_min - D\_t\_r)[1 + (m\_wc - 1)X]}{1 + (m\_bc - 1)X} + D\_t\_r$$

where D_cell_max is the maximum net cell delay, D_cell_min is the best case minimum net cell delay, m_wc is the worst case multiplier, m_bc is the best case multiplier, and X is the coupling ratio in equation (4).

In step 328, the typical net cell delay is calculated, for eaxmple, as the mean of the minimum net cell delay and the maximum net cell delay.

In step 330, the steps 306–328 are repeated for each net in the integrated circuit design.

Step 332 is the exit point of the flow chart 300.

The method illustrated in the flowchart of FIG. 3 may be embodied in a computer program product and implemented by a computer according to well known programming techniques.

The exemplary flow charts and computer program steps described above have been shown with reference to specific steps performed in a specific order; however, these steps may be combined, sub-divided, or reordered in other embodiments without departing from the scope of the claims. Except as explicitly indicated herein, the order and grouping of steps is not a limitation of the present invention.

The specific embodiments and applications thereof described above are for illustrative purposes only and do not preclude modifications and variations that may be made within the scope of the following claims.

What is claimed is:

1. A method comprising steps of:
   (a) providing a coupling capacitance, a net capacitance, and one of a worst case maximum net interconnect delay and a best case minimum net interconnect delay of a net comprising a net cell and a net interconnect in an integrated circuit design;
   (b) providing a worst case margin multiplier and a best case margin multiplier for the integrated circuit design;
   (c) calculating and generating as output a worst case minimum net interconnect delay from the worst case maximum net interconnect delay, the coupling capacitance, the net capacitance, and the worst case margin multiplier when the worst case maximum net interconnect delay is provided in step (a); and
   (d) calculating and generating as output a best case maximum net interconnect delay from the best case minimum net interconnect delay, the net capacitance, and the best case margin multiplier when the best case minimum net interconnect delay is provided in step (a).

2. The method of claim 1 further comprising calculating the worst case minimum net interconnect delay in step (c) substantially from

MIN=MAX*(1−X)

wherein MIN is the worst case minimum net interconnect delay, MAX is the worst case maximum net interconnect delay provided in step (a), and X is a coupling ratio equal to the coupling capacitance divided by the net capacitance.

3. The method of claim 1 further comprising calculating the best case maximum net interconnect delay in step (d) substantially from

MAX=MIN*(1+X)

wherein MAX is the best case minimum net interconnect delay, MIN is the best case minimum net interconnect delay provided in step (a), and X is a coupling ratio equal to the coupling capacitance divided by the net capacitance.

4. The method of claim 3 further comprising a step of calculating a typical net interconnect delay as a mean of the worst case minimum net interconnect delay and the worst case maximum net interconnect delay.

5. The method of claim 1 further comprising a step of calculating a typical net interconnect delay from the worst case maximum net interconnect delay, the coupling capacitance, the net capacitance, and the worst case margin multiplier when the worst case maximum net interconnect delay is provided in step (a).

6. The method of claim 5 further comprising calculating the typical net interconnect delay substantially from

TYP=MAX(1−0.5X)

wherein TYP is the typical net interconnect delay, MAX is the worst case maximum net interconnect delay provided in step (a), and X is a coupling ratio equal to the coupling capacitance divided by the net capacitance.

7. The method of claim 1 further comprising a step of calculating a typical net interconnect delay from the best case minimum net interconnect delay, the coupling capacitance, the net capacitance, and the best case margin multiplier when the best case minimum net interconnect delay is provided in step (a).

8. The method of claim 7 further comprising calculating the typical net interconnect delay substantially from

TYP=MIN(1+0.5X)

wherein TYP is the typical net interconnect delay, MIN is the best case minimum net interconnect delay provided in step (a), and X is a ratio of the coupling capacitance divided by the net capacitance.

9. The method of claim 1 further comprising steps of:
   (e) providing one of a worst case maximum net cell delay and a best case minimum net cell delay of the net;
   (f) providing a value of a function of input ramptime of the net cell;
   (g) calculating a minimum net cell delay from the worst case maximum net cell delay, the net capacitance, the best case margin multiplier, the worst case margin multiplier, and the value of the function of input ramptime when the worst case maximum net cell delay is provided in step (e); and
   (h) calculating a maximum net cell delay from the best case minimum net cell delay, the net capacitance, the best case margin multiplier, the worst case margin multiplier, and the value of the function of input ramptime when the best case minimum net cell delay is provided in step (e).

10. The method of claim 9 further comprising calculating the value of the function of input ramptime substantially from $$D\_t\_r = \frac{D\_0.5(C\_min, t\_r)C\_max - D\_0.5(C\_max, t\_r)C\_min}{C\_max - C\_min}$$

wherein D_t_r is the value of the function of input ramptime, t_r is the input ramptime of the net cell, C_min is a minimum load capacitance of the net cell, C_max is a maximum load capacitance of the net cell, and D_0.5 is an intrinsic delay for the input ramptime of the net cell and the load capacitance.

11. The method of claim 10 further comprising calculating the minimum net cell delay in step (g) substantially from $$D\_cell\_min = \frac{(D\_cell\_max - D\_t\_r)[1 + (m\_bc - 1)X]}{1 + (m\_wc - 1)X} + D\_t\_r$$

wherein D_cell_min is the minimum net cell delay, D_cell_max is the worst case maximum net cell delay, m_wc is the worst case multiplier, m_bc is the best case multiplier, and X is a ratio of the coupling capacitance divided by the net capacitance.

12. The method of claim 11 further comprising a step of calculating a typical net cell delay as a mean of the minimum net cell delay and the maximum net cell delay.

13. The method of claim 11 further comprising calculating the maximum net cell delay in step (h) substantially from $$D\_cell\_max = \frac{(D\_cell\_min - D\_t\_r)[1 + (m\_wc - 1)X]}{1 + (m\_bc - 1)X} + D\_t\_r$$

wherein D_cell_max is the maximum net cell delay, D_cell_min is the best case minimum net cell delay, m_wc is the worst case multiplier, m_bc is the best case multiplier, and X is a ratio of the coupling capacitance divided by the net capacitance.

14. The method of claim 13 further comprising a step of calculating a typical net cell delay as a mean of the worst case minimum net interconnect delay and the worst case maximum net cell delay.

15. A computer program product comprising:
   a computer readable medium for embodying a computer program for input to a computer; and
   a computer program embodied in the medium for causing the computer to perform steps of:
   (a) providing a coupling capacitance, a net capacitance, and one of a worst case maximum net interconnect delay and a best case minimum net interconnect delay of a net comprising a net cell and a net interconnect in an integrated circuit design;
   (b) providing a worst case margin multiplier and a best case margin multiplier for the integrated circuit design;
   (c) calculating a worst case minimum net interconnect delay from the worst case maximum net interconnect delay, the coupling capacitance, the net capacitance, and the worst case margin multiplier when the worst case maximum net interconnect delay is provided in step (a); and
   (d) calculating a best case maximum net interconnect delay from the best case minimum net interconnect delay, the net capacitance, and the best case margin multiplier when the best case minimum net interconnect delay is provided in step (a).

16. The computer program product of claim 15 further comprising calculating the worst case minimum net interconnect delay in step (c) substantially from $$MIN=MAX(1-X)$$

wherein MIN is the worst case minimum net interconnect delay, MAX is the worst case maximum net interconnect delay provided in step (a), and X is a ratio of the coupling capacitance divided by the net capacitance.

17. The computer program product of claim 15 further comprising calculating the best case maximum net interconnect delay in step (d) substantially from $$MAX=MIN(1+X)$$

wherein MAX is the best case minimum net interconnect delay, MIN is the best case minimum net interconnect delay provided in step (a), and X is a ratio of the coupling capacitance divided by the net capacitance.

18. The computer program product of claim 15 further comprising a step of calculating a typical net interconnect delay as a mean of the worst case minimum net interconnect delay and the worst case maximum net interconnect delay.

19. The computer program product of claim 15 further comprising a step of calculating a typical net interconnect delay from the worst case maximum net interconnect delay, the coupling capacitance, the net capacitance, and the worst case margin multiplier when the worst case maximum net interconnect delay is provided in step (a).

20. The computer program product of claim 19 further comprising calculating the typical net interconnect delay substantially from $$TYP=MAX(1-0.5X)$$

wherein TYP is the typical net interconnect delay, MAX is the worst case maximum net interconnect delay provided in step (a), and X is a ratio of the coupling capacitance divided by the net capacitance.

21. The computer program product of claim 15 further comprising a step of calculating a typical net interconnect delay from the best case minimum net interconnect delay, the coupling capacitance, the net capacitance, and the best case margin multiplier when the best case minimum net interconnect delay is provided in step (a).

22. The computer program product of claim 21 further comprising calculating the typical net interconnect delay substantially from $$TYP=MIN(1+0.5X)$$

wherein TYP is the typical net interconnect delay, MIN is the best case minimum net interconnect delay provided in step (a), and X is a ratio of the coupling capacitance divided by the net capacitance.

23. The computer program product of claim 15 further comprising steps of:
   (e) providing one of a worst case maximum net cell delay and a best case minimum net cell delay of the net;
   (f) providing a value of a function of input ramptime of the net cell;
   (g) calculating a minimum net cell delay from the worst case maximum net cell delay, the net capacitance, the best case margin multiplier, the worst case margin multiplier, and the value of the function of input ramptime when the worst case maximum net cell delay is provided in step (e); and
   (h) calculating a maximum net cell delay from the best case minimum net cell delay, the net capacitance, the best case margin multiplier, the worst case margin multiplier, and the value of the function of input ramptime when the best case minimum net cell delay is provided in step (e).

24. The computer program product of claim 23 wherein the value of the function of input ramptime is calculated substantially from $$D\_t\_r = \frac{D\_0.5(C\_min, t\_r)C\_max - D\_0.5(C\_max, t\_r)C\_min}{C\_max - C\_min}$$

wherein $D\_t\_r$ is the value of the function of input ramptime, $t\_r$ is the input ramptime of the net cell, $C\_min$ is a minimum load capacitance of the net cell, $C\_max$ is a maximum load capacitance of the net cell, and $D\_0.5$ is an intrinsic delay for the input ramptime of the net cell and the load capacitance.

25. The computer program product of claim 24 wherein step (g) comprises calculating the minimum net cell delay substantially from $$D\_cell\_min = \frac{(D\_cell\_max - D\_t\_r)[1 + (m\_bc - 1)X]}{1 + (m\_wc - 1)X} + D\_t\_r$$

wherein $D\_cell\_min$ is the minimum net cell delay, $D\_cell\_max$ is the worst case maximum net cell delay, $m\_wc$ is the worst case multiplier, $m\_bc$ is the best case multiplier, and $X$ is a ratio of the coupling capacitance divided by the net capacitance.

26. The computer program product of claim 25 further comprising a step of calculating a typical net cell delay as a mean of the minimum net cell delay and the maximum net cell delay.

27. The computer program product of claim 25 wherein step (h) comprises calculating the maximum net cell delay substantially from $$D\_cell\_max = \frac{(D\_cell\_min - D\_t\_r)[1 + (m\_wc - 1)X]}{1 + (m\_bc - 1)X} + D\_t\_r$$

wherein $D\_cell\_max$ is the maximum net cell delay, $D\_cell\_min$ is the best case minimum net cell delay, $m\_wc$ is the worst case multiplier, $m\_bc$ is the best case multiplier, and $X$ is a ratio of the coupling capacitance divided by the net capacitance.

28. The computer program product of claim 27 further comprising a step of calculating a typical net cell delay as a mean of the worst case minimum net cell delay and the worst case maximum net cell delay.

* * * * *